United States Patent
Satoh et al.

(10) Patent No.: US 8,574,928 B2
(45) Date of Patent: Nov. 5, 2013

(54) MRAM FABRICATION METHOD WITH SIDEWALL CLEANING

(75) Inventors: Kimihiro Satoh, Beaverton, OR (US);
Yiming Huai, Pleasanton, CA (US);
Yuchen Zhou, San Jose, CA (US); Jing Zhang, Los Altos, CA (US); Dong Ha Jung, Pleasanton, CA (US); Ebrahim Abedifard, Sunnyvale, CA (US); Rajiv Yadav Ranjan, San Jose, CA (US); Parviz Keshtbod, Los Altos Hills, CA (US)

(73) Assignee: Avalanche Technology Inc., Fremont, CA (US)

( * ) Notice: Subject to any disclaimer, the term of this patent is extended or adjusted under 35 U.S.C. 154(b) by 101 days.

(21) Appl. No.: 13/443,818

(22) Filed: Apr. 10, 2012

(65) Prior Publication Data

US 2013/0267042 A1 Oct. 10, 2013

(51) Int. Cl.
*H01L 21/00* (2006.01)

(52) U.S. Cl.
USPC ................................ 438/3; 438/735; 438/738

(58) Field of Classification Search
USPC .............................................................. 438/3
See application file for complete search history.

(56) References Cited

U.S. PATENT DOCUMENTS

| | | | |
|---|---|---|---|
| 7,897,950 B2 | 3/2011 | Shoji | |
| 7,898,007 B2 | 3/2011 | Lee et al. | |
| 7,906,347 B2 | 3/2011 | Sato | |
| 7,919,794 B2 | 4/2011 | Gu et al. | |
| 7,919,826 B2 | 4/2011 | Iwayama et al. | |
| 7,936,027 B2 | 5/2011 | Xiao et al. | |
| 7,955,870 B2 | 6/2011 | Ditizio | |
| 7,985,667 B2 | 7/2011 | Cho | |
| 7,989,224 B2 | 8/2011 | Gaidis | |
| 2008/0265347 A1* | 10/2008 | Iwayama et al. | 257/421 |
| 2010/0181654 A1 | 7/2010 | Fujiwara et al. | |
| 2011/0143514 A1 | 6/2011 | Liaw et al. | |
| 2012/0282711 A1* | 11/2012 | Abedifard et al. | 438/3 |
| 2013/0052752 A1* | 2/2013 | Satoh et al. | 438/3 |

* cited by examiner

*Primary Examiner* — Ajay K Arora
(74) *Attorney, Agent, or Firm* — G. Marlin Knight

(57) ABSTRACT

Fabrication methods for MRAM are described wherein any re-deposited metal on the sidewalls of the memory element pillars is cleaned before the interconnection process is begun. In embodiments the pillars are first fabricated, then a dielectric material is deposited on the pillars over the re-deposited metal on the sidewalls. The dielectric material substantially covers any exposed metal and therefore reduces sources of re-deposition during subsequent etching. Etching is then performed to remove the dielectric material from the top electrode and the sidewalls of the pillars down to at least the bottom edge of the barrier. The result is that the previously re-deposited metal that could result in an electrical short on the sidewalls of the barrier is removed. Various embodiments of the invention include ways of enhancing or optimizing the process. The bitline interconnection process proceeds after the sidewalls have been etched clean as described.

14 Claims, 7 Drawing Sheets

U S 8,574,928 B2

MRAM FABRICATION METHOD WITH SIDEWALL CLEANING

FIELD OF THE INVENTION

The present invention relates generally to fabrication methods for semiconductor Back-End-Of-Line (BEOL) memories including Magnetic Random Access Memory (MRAM) and more particularly to fabrication methods for MRAM that include ways of preventing interlayer shorting from metallic re-deposition material on sidewalls of the memory elements.

BACKGROUND

The BEOL memories such as RRAM (Resistive Random Access Memory), PRAM (Phase Change Random Access Memory), and MRAM have a resistive device as a memory element. These memories are expected to have wide application because of their high access speed and non-volatility at power-off.

The memory device includes a multilayer magnetoresistive memory element in between a top electrode and a bottom electrode. The resistive memory element of MRAM is a Magnetic Tunnel Junction (MTJ) including a free layer and a fixed layer separated by a barrier layer. A magnetic moment of the free layer is manipulated by an electric current between the electrodes to be parallel or antiparallel to the fixed layer by an electric current between the electrodes. Whether the magnetic vector of the free layer is parallel or antiparallel to the fixed layer determines the low or high resistance state of the MTJ, which can be read using an electrical current that does not alter magnetic orientation. The two resistance states can be used as memory states "0" or "1".

FIG. 1 illustrates a cross sectional view of the thin film layers at a selected stage of the fabrication process of MTJ memory cells according to the prior art. At the stage shown in FIG. 1, the unpatterned layers of MTJ film stack 20 have been deposited over the wafer onto the previously fabricated landing pads 21 or contact studs that connect to a control structures 19 like an FET and/or diode. The MTJ layer stack 20 includes unpatterned layers for the bottom electrode layer 22, lower magnetic layer 23, barrier layer 24, upper magnetic layer 25 and top electrode 26. Either one of the magnetic layers 23, 25 can be designed to work as a pinned layer with a fixed magnetic field and the other one acts as a free layer with a magnetization orientation that is manipulated by a vertical current that flow through the memory element between the electrodes. The barrier layer 24 is a dielectric film such as MgO or $Al_2O_3$ designed as efficiently manipulating TMR. The bottom electrode 22 and the top electrode 26 are primarily Ta or Ta alloys. A hard mask, which is not shown, can also be deposited as part of the standard fabrication process.

During the fabrication process, after the stage shown in FIG. 1, arrays of MTJ pillars 30 containing the patterned layers for the memory elements are formed on the wafer using conventional lithography and dry etching as shown in FIG. 2. The MTJ pillar 30 includes a bottom electrode 22', a lower magnetic layer 23', a barrier layer 24', an upper magnetic layer 25' and a top electrode 26'. The dry etching process often sputters metal and re-deposits it on MTJ pillar sidewall which is especially deleterious on the barrier layer. The metallic re-deposition material 27 can electrically short the pinned layer and the free layer across the sidewall area 28 of barrier layer 24' rendering the device inoperable.

Sources of the re-deposition metal can be the MTJ stack itself or the landing pad metal that was deposited and patterned before the MTJ layer stack. After the etching process has removed the layers down through the barrier layer, the exposed sidewalls of the layers for the memory element become susceptible to being shorted with the re-deposited metal. The MTJ pillar is exposed to the process environment at this point in the process. After the unprotected material in bottom electrode layer is etched away, additional metal structures that were deposited and patterned below the MTJ layer are now exposed to the etching ambient. These previous structures include not only the MTJ landing pad but also peripheral circuitry. Thus there are several sources of metal that can be sputtered out and then re-deposited on the sidewall of the pillar.

The MTJ and bottom electrode layers are etched conventionally with ion milling or high-biased reactive ion etching where elements are mainly removed mechanically. Freed electrically conductive material generated by mechanical etching is easily re-deposited on the exposed sidewalls and can cause a short defect. However, during the etching process material is also being removed from the sidewalls, so it is the net result of these opposing processes that determines the final amount of re-deposited material that remains on the sidewalls. One variable is the slope of the sidewall, because the removal rate is faster on a shallow sloped sidewall. Also the re-deposition rate lowers with a decrease in remaining re-deposition source material.

SUMMARY OF THE INVENTION

Embodiments of the invention include fabrication methods for MRAM wherein any re-deposited metal on the sidewalls of the memory element pillars is cleaned before the interconnection process is begun. In embodiments the memory element pillars are first fabricated, then a dielectric material is deposited on the memory element pillars over the re-deposited metal on the sidewalls. The dielectric material substantially covers any exposed metal and therefore reduces sources of re-deposition during subsequent etching. Etching is then performed to remove the dielectric material from the top electrode and the sidewalls of the pillars down to at least the bottom edge of the barrier. The result is that the previously re-deposited metal that could result in an electrical short on the sidewalls of the barrier is removed. Various embodiments of the invention include ways of enhancing or optimizing the process.

A first embodiment of the invention includes directionally depositing the dielectric film to create a thinner film on MTJ pillar sidewalls than on the planar areas. Because directional deposition allows a thinner film to be formed on the sidewalls it is preferable to non-directional deposition. The embodiment then uses physical etching using an inert or chemically inactive gas is used to remove re-deposited metal together with the dielectric material from the sidewalls. A relatively high electrical bias is preferably applied to the substrate during the etching. The etching process also removes the dielectric material from the top electrode to allow subsequent interconnection to bitlines.

A second embodiment deposits an oxygen-free dielectric film on the sidewalls using high density plasma CVD. Vertical etching with appropriate chemistry systems, such as $CH_3OH$ or $CO/NH_3$, is then used to remove re-deposited metal together with the dielectric material from the sidewalls and the top electrode.

A third embodiment first deposits a relatively thin oxygen-free dielectric film and then a thicker film of, for example, silicon oxide. are deposited on the sidewall and planarized with CMP. The first dielectric layer is preferably thin and roughly conforms to the topography of the pillars. The second dielectric film is relatively thick to allow the wafer to be planarized with CMP. Vertical etching with appropriate chemistry systems, such as $CH_3OH$ or $CO/NH_3$, is then used to remove re-deposited metal together with the dielectric material from the sidewalls of the barrier layer and the top electrode.

In each embodiment, the bitline interconnection process phase of the fabrication proceeds after the sidewalls have been etched as described. This process embodiment deposits an oxygen-free dielectric material and an inter-layer dielectric (ILD) material over the pillars on the wafer. The ILD material is selected to have a higher etching rate in the selected dry etching process than the oxygen-free dielectric material. The wafer is planarized using CMP. The trench lines are patterned across the top electrodes using the selected dry etching process to remove inter-layer dielectric (ILD) material down to the oxygen-free dielectric material which acts as an etch stop. The top electrodes in the pillars are exposed using a second selected dry etching process to remove the oxygen-free dielectric material. The fabrication process continues with the bitline interconnection process is which metal is deposited metal over the exposed top electrodes in trench lines to form bitlines for interconnection.

BRIEF DESCRIPTION OF THE FIGURES

FIG. 2 shows arrays of MTJ pillars 30 containing the layers for the memory elements formed on the wafer according to the prior art that have undesirable re-deposition material on the sidewalls.

In FIG. 3 a dielectric layer is formed over the MTJ pillars with directional deposition.

FIG. 4 illustrates a cross sectional view of a process stage subsequent to that of FIG. 3 after sidewall cleaning has been performed.

FIG. 5 illustrates a cross sectional view of a process stage subsequent to that of FIG. 4 after dielectric films 31, 32 have been deposited on the cleaned MTJ pillars.

FIG. 6 illustrates a cross sectional view of a process stage subsequent to that of FIG. 5 after trench lines 42 have been formed in the dielectric 32.

FIG. 7 illustrates a cross sectional view of a process stage subsequent to that of FIG. 6 after etching is performed to remove enough of the dielectric layer 31 to expose the upper surface of top electrode 26'.

FIG. 8 illustrates a cross sectional view of a process stage subsequent to that of FIG. 7 after the interconnection process is resumed with a damascene process filling the trench lines with Cu to form bitlines.

FIG. 9 illustrates a cross sectional view of a process stage subsequent to that of FIG. 2 after the deposition of dielectric material 51.

FIG. 10 illustrates a cross sectional view of a process stage subsequent to that of FIG. 9 after etching the dielectric material and removing the undesirable re-deposition material from the sidewall of the barrier layer.

FIG. 11 illustrates a cross sectional view of a process stage subsequent to that of FIG. 2 after the deposition of dielectric material 53.

FIG. 12 illustrates a cross sectional view of a process stage subsequent to that of FIG. 11 after dielectric film 61 has been deposited and then planarized with CMP.

FIG. 13 illustrates a cross sectional view of a process stage subsequent to that of FIG. 12 after the dielectric films have been etched down to below the barrier level.

DETAILED DESCRIPTION OF THE INVENTION

In the following description of the embodiments, reference is made to the accompanying drawings that form a part hereof, and in which is shown by way of illustration of specific embodiments in which the invention may be practiced. It is to be understood that other embodiments may be utilized without departing from the scope of the present invention. It should be noted that the figures discussed herein are not drawn to scale and thicknesses of lines are not indicative of actual sizes. The cross section view in the figures is generally taken through the approximate center the memory cell in a plane perpendicular to the substrate except where otherwise noted. Although only one or two cells are shown in the figures, the method may used for the simultaneous fabrication of many cells on a wafer according to standard techniques.

First Embodiment

Figure 1:
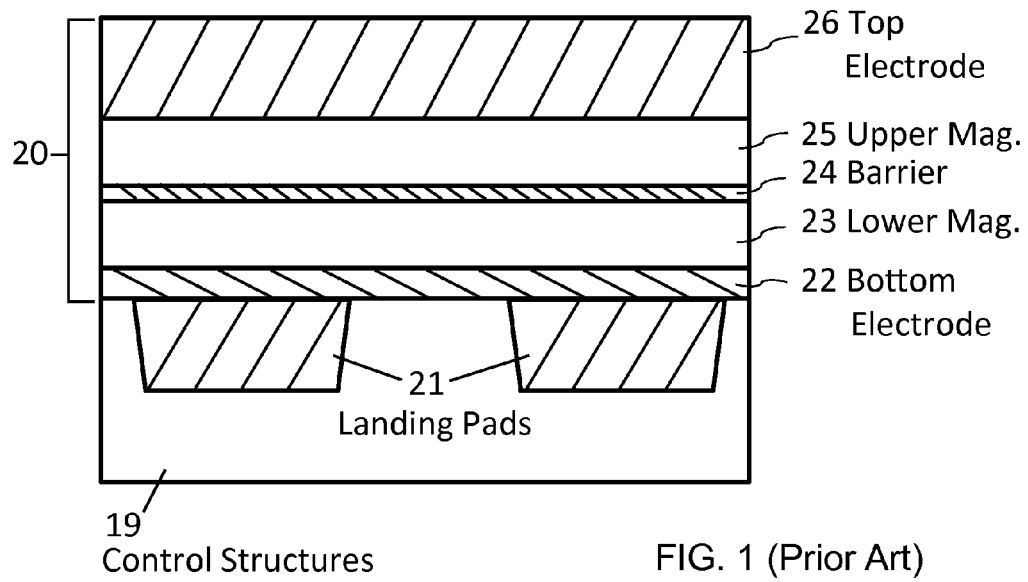
FIG. 1 illustrates a cross sectional view of the thin film layers at a selected stage of the fabrication process of MTJ memory cells according to the prior art.
Figure 2:
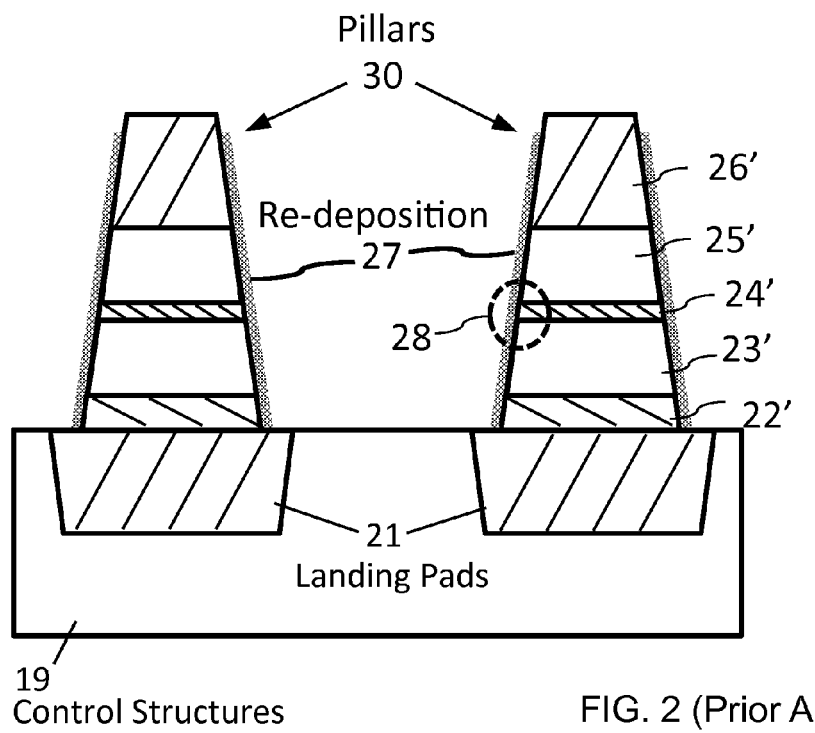
FIG. 2 illustrates a cross sectional view of the thin film layers at a selected stage of the fabrication process of MTJ memory cells that is subsequent to the stage of FIG. 1.
Figure 3:
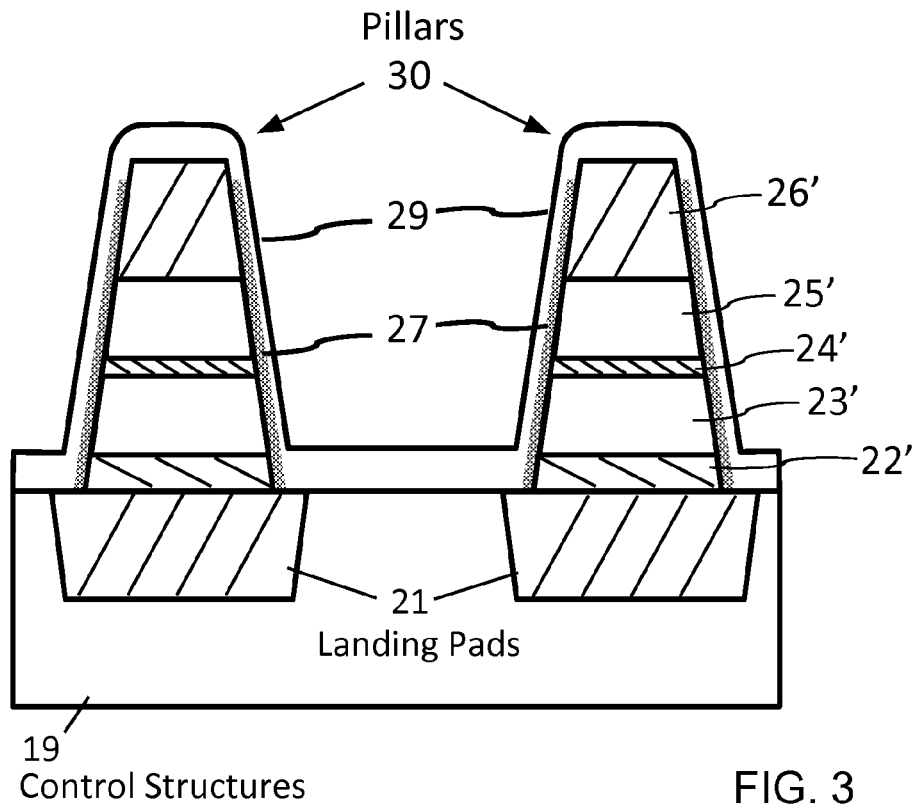
FIG. 3-FIG. 8 illustrate cross sectional views of process stages for the first embodiment of the invention.

FIGS. 3-8 will be used to illustrate the first embodiment of the invention. The process stage in FIG. 3 follows that of FIG. 2. FIG. 3 illustrates the result of the deposition of dielectric film 29 over the pillars. The dielectric layer 29 has been formed over the MTJ pillars 30 by vertical directional deposition such as down-flow CVD or biased CVD. Accordingly the dielectric layer 29 is thicker in flat area such as the space between the pillars and is thinner on the sidewalls. The dielectric layer 29 completely covers the undesirable re-deposition material 27 and generally conforms to the existing topography of the pillars.

Figure 4:
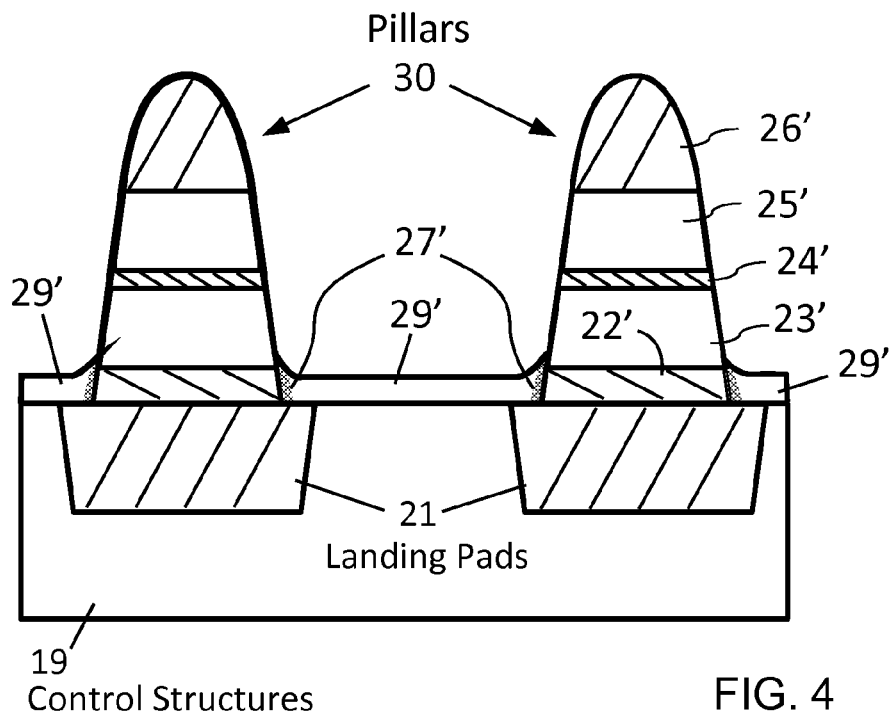

FIG. 4 illustrates a cross sectional view of a process stage, subsequent to that of FIG. 3, after sidewall cleaning has been performed using an etching technique that results in the top surface of the pillar being etched faster than the other surfaces which are etched isotropically. Although the dielectric material 29 on top of the pillars is thicker than on the sidewall, the top is more exposed to the etching ambient. This etching requirement is met by dry etching using an inert gas such as argon (Ar) along with a relatively high electrical bias being applied to the wafer. In some embodiments, ion milling etching may also be applied by itself or in combination with dry etching. The removal rate for this type of etching is not sensitive to the type of material, so the rate does not vary greatly across different materials. Thus, this etching technique first removes substantially all of the thinner dielectric material 29 and re-deposition material 27 on the sidewalls as shown in FIG. 4. Then as the etching proceeds, all of the dielectric material 29 is removed from the top surface of the MTJ pillar and some rounding of the outer edges of the top electrode 26' occurs. In this way the sidewall of each pillar is cleaned of unwanted material that could short the layers of the MTJ without damaging the essential structures which include the top electrode. When this phase of the process ends, residual dielectric material 29' remains on the planar surfaces between the pillars, and small areas of re-deposition material 27' also remain on the sidewalls of the bottom electrode layer 22' and possibly a small portion of the lower magnetic layer 23'. As long as the barrier layer sidewall is completely cleaned of material, the re-deposition material 27' causes no problems.

Figure 5:
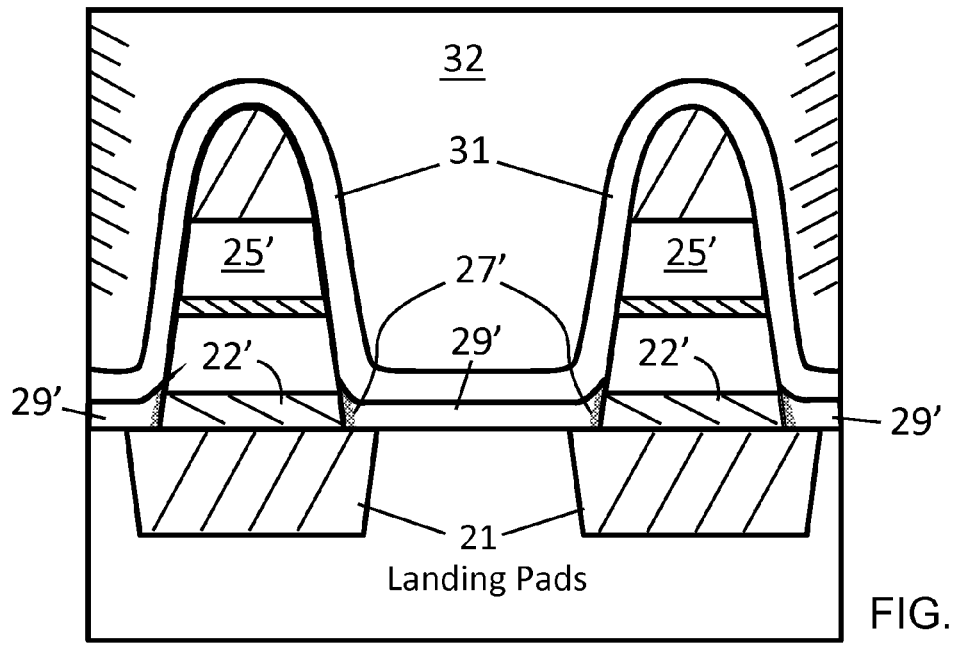
Figure 6:
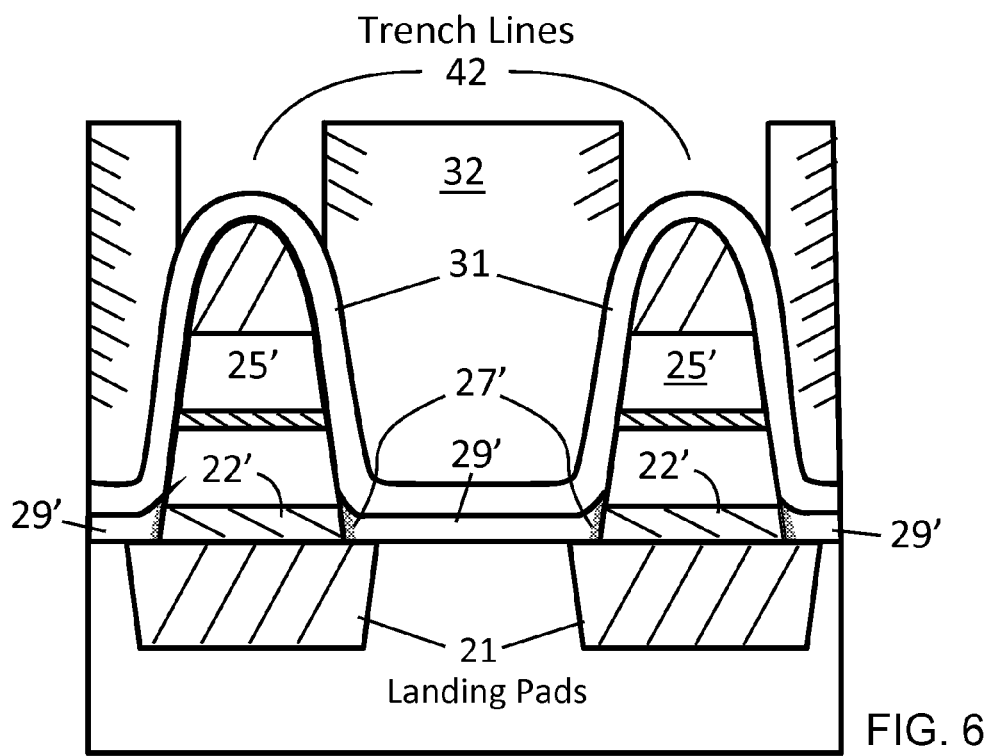

FIG. 5 to FIG. 8 will be used to describe the interconnect process to connect the top electrode 26' to a standard bitline. A relatively thin oxygen free dielectric film 31 such as a silicon nitride or a silicon carbide is deposited on the cleaned MTJ pillar as shown in FIG. 5. This dielectric film 31 substantially conforms to the topography of the pillars. Next a relatively thick inter-layer dielectric (ILD) 32 such as silicon oxide is deposited and planarized with CMP. The materials for layers 31, 32 are selected so that the etching rate of dielectric material 31 in the ILD etching ambient is much smaller than the etching rate of the ILD material 32. This allows the dielectric material 31 to work as an etch stopper when conventional trench lines 42 (as shown in FIG. 6) are formed in the ILD 32 using conventional lithography and dry etching. Layer 31 can also be composed of more than one layer to make selection of etching ambient more flexible. The additional layers can be selected according to the prior art.

Figure 7:
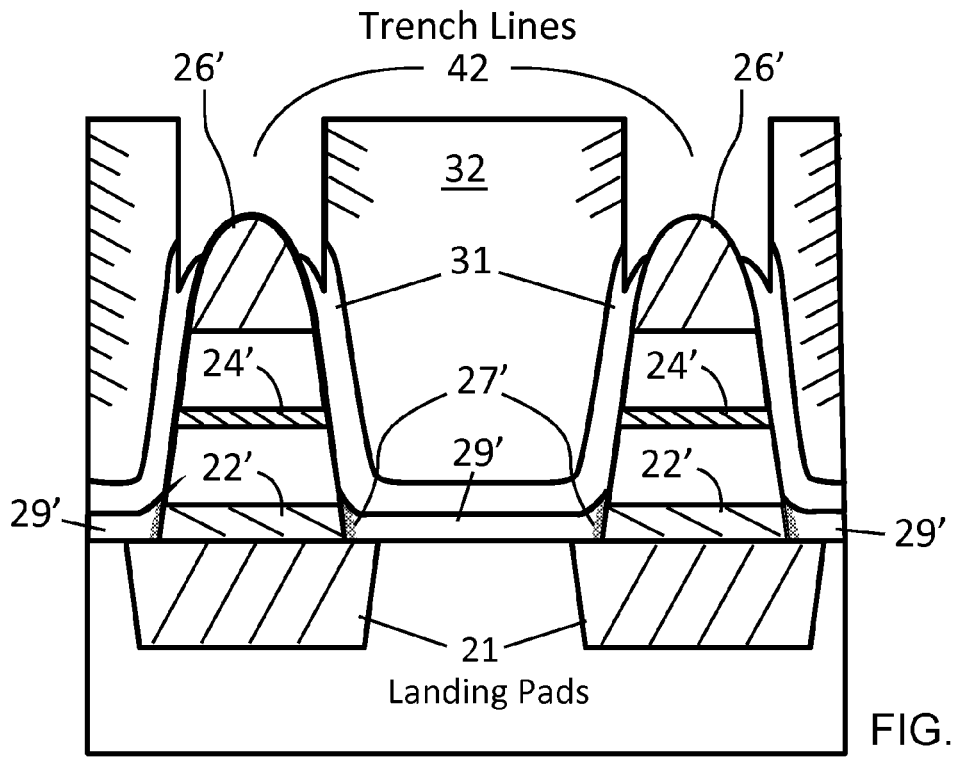
Figure 8:
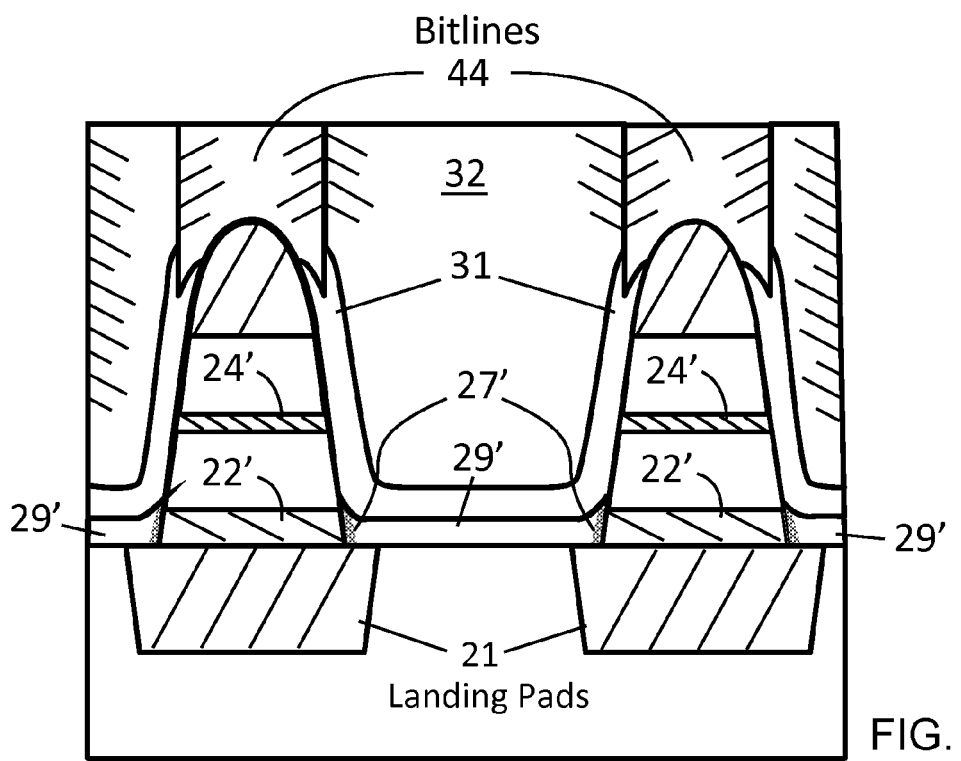

The result of the next phase of the process is illustrated in FIG. 7. The result of the prior process etching phase exposed the dielectric layer 31 at the bottom of the trench lines 42. Another etching step is performed to remove enough of the dielectric layer 31 to expose the upper surface of top electrode 26'. The material for layer 31 was selected to be resistant to the etching process used for the ILD 32 material. Therefore, a different etching chemistry, one appropriate for the material is now used to vertically etch exposed dielectric film 31. The etching continues until a sufficient area of the top electrode 26' has been exposed to allow the electrical interconnect to be made. Like a conventional spacer etching process, the vertical etching leaves dielectric material 31 on the sidewall of the barrier layer 24' for protection. After the top electrode 26' is exposed, the interconnection process is resumed with a conventional damascene process filling the trench lines with copper (Cu) to form bitlines 44 as shown in FIG. 8. It should be noted that this process formed the bitlines without the need for a via mask. Thus, in this embodiment of the invention the MTJ is directly connected to the bit line without the use of a via or the process steps for forming the via.

Second Embodiment

Figure 9:
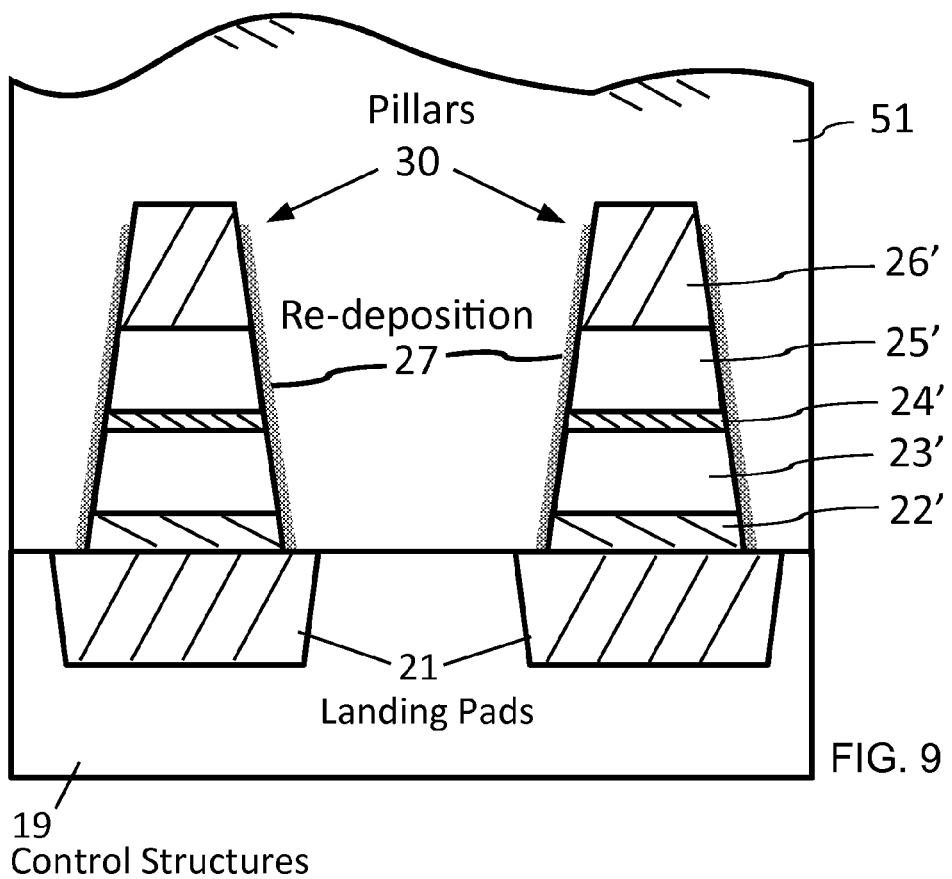
FIGS. 9 and 10 illustrate a second embodiment of the invention using high density plasma CVD for sidewall cleaning.
Figure 10:
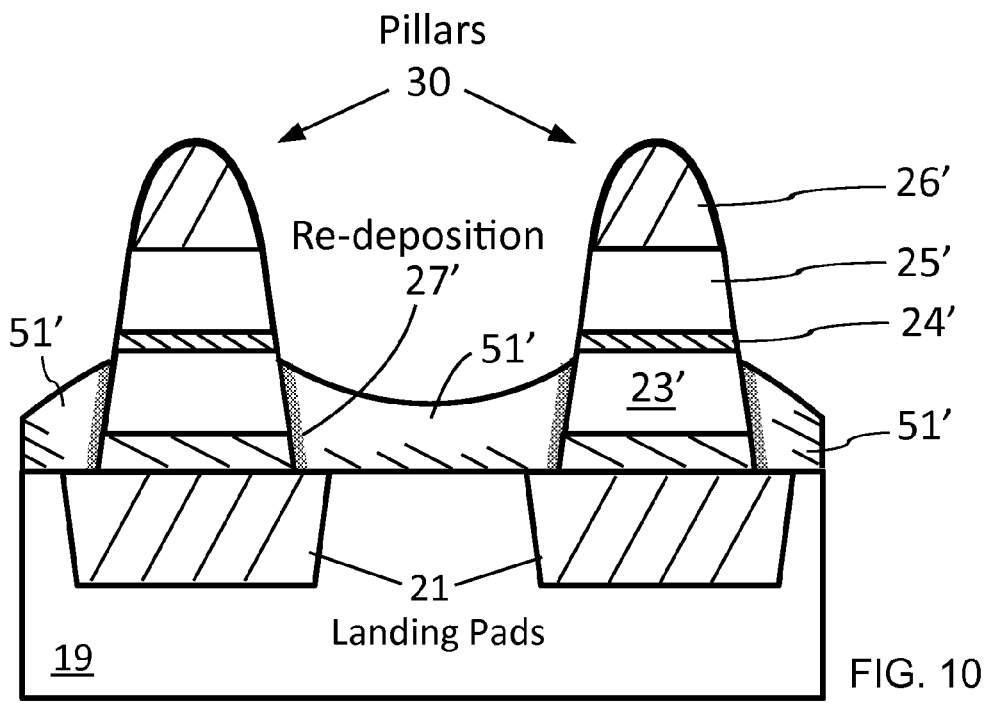

FIGS. 9 and 10 illustrate a second embodiment of the invention which uses high density plasma CVD for sidewall cleaning. As for the first embodiment, the pillars are patterned as shown in FIG. 2. FIG. 9 shows that a relatively thick dielectric material 51 has been deposited over the pillars 30 which include metallic re-deposition material 27 on the sidewalls as described above. The dielectric material 51 is selected to be an oxygen-free material such as silicon nitride or silicon carbide. The dielectric material 51 is thinner on top of the pillars than in the valley areas between the pillars. Next a dry etching is used to etch the dielectric material 51 and re-deposition material 27. The chemistry system is selected for more rapid removal of the dielectric material 51 and slower removal of the material in the top electrode 26'. Appropriate systems include $CH_3OH$ and $CO/NH_3$ and the like. The dielectric material 51 is vertically etched to the stage as shown in FIG. 10 and the re-deposition material 27 is removed where it is exposed as well. The etching process should continue until the sidewalls of the barrier layers 24' have been cleaned of undesirable re-deposition material. Residual re-deposition material 27' can remain on the sidewall of the lower magnetic layer 23' and bottom electrode 22' without deleterious effect. From the stage shown in FIG. 10, the process proceeds according to the first embodiment to connect a metal bitline to the top electrodes as illustrated in FIG. 5 to FIG. 8 and described above.

Third Embodiment

Figure 11:
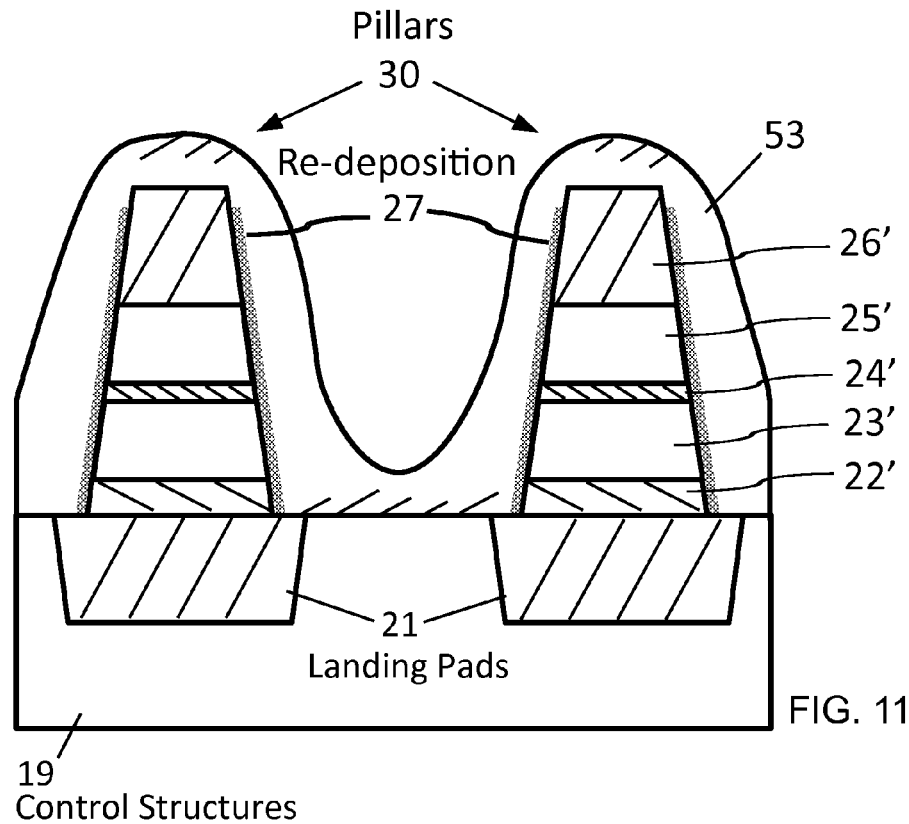
FIGS. 11 to 13 illustrate a third embodiment of the invention that uses CMP for sidewall cleaning after the pillars have been patterned as illustrated in FIG. 2.
Figure 12:
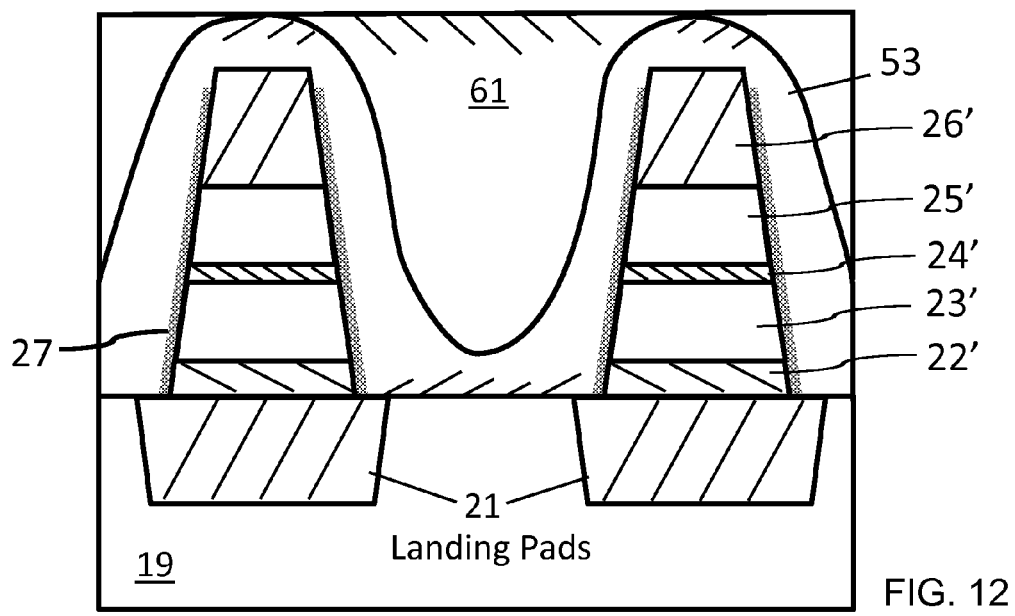
Figure 13:
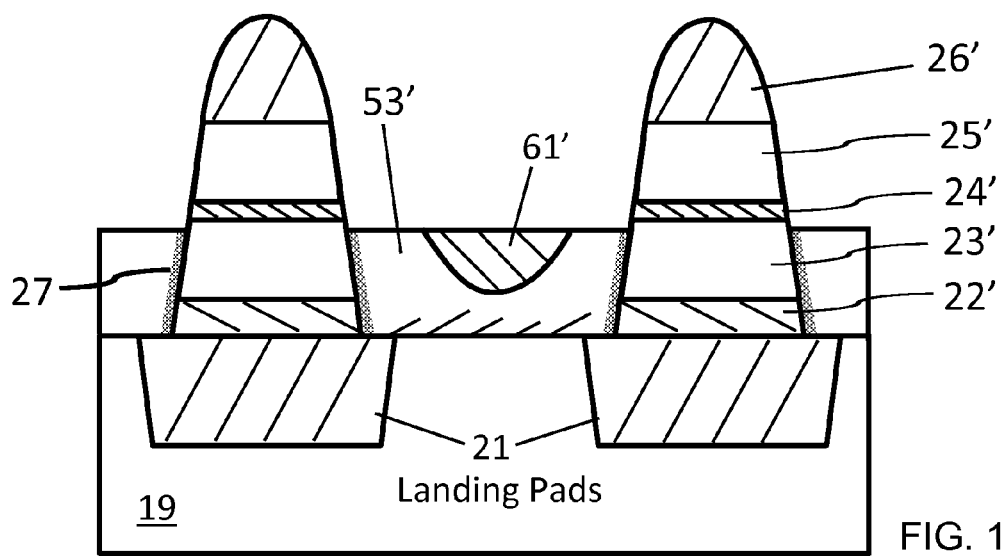

FIG. 11 to FIG. 13 illustrate a third embodiment of the invention that uses CMP for sidewall cleaning. The pillars are first patterned as illustrated in FIG. 2. FIG. 11 shows that a dielectric material 53 has been deposited over the pillars 30 in a relatively thin layer that roughly conforms to the topography of the pillars. The dielectric material 53 is selected to be an oxygen-free material such as silicon nitride or silicon carbide and like materials. The next part of the process is illustrated in FIG. 12 which shows that a relatively thick dielectric film 61, such as one of the silicon oxides, has been deposited and then the wafer has been planarized with CMP. Next the dielectric layers 53, 61 are vertically etched. The chemistry system is selected to have high selectivity for more rapid removal of the dielectric material 53, 61 and slower removal of the material in the top electrode 26'. Appropriate systems include $CH_3OH$ and $CO/NH_3$ and the like.

The dielectric material 53, 61 are vertically etched to the stage as shown in FIG. 13 leaving residual dielectric material 53', 61'. As in the second embodiment the etching continues until the dielectric material and the re-deposition material 27 has been removed from the top electrode 26', as well as the sidewalls of upper magnetic layer 25' and barrier layer 24'. At this point the sidewalls of the barrier layers 24' have been cleaned of undesirable re-deposition material. The surface levels of residual dielectric material 53', 61' are below the level of the barrier layers 24'. Because the first dielectric layer 53 was thin, the residual dielectric material 61' filled in the central area between the pillars and the residual dielectric material 53' forms a cup-like surround for the residual dielectric material 61'.

As noted for the second embodiment, residual re-deposition material 27' can remain on the sidewall of the lower magnetic layer 23' and the bottom electrode 22' without deleterious effect. From the stage shown in FIG. 13, the process proceeds according to the first embodiment to connect a metal bitline to the top electrodes as illustrated in FIG. 5 to FIG. 8 and described above.

The invention claimed is:

1. A method for fabricating thin film magnetic memory cells on a wafer comprising:
    depositing a stack of layers for a magnetic tunnel junction memory device including a top electrode, a bottom electrode and an upper magnetic layer and a lower magnetic layer separated by a barrier layer;
    patterning the stack of layers to form a plurality of pillars with an upper surface being the top electrode and the upper magnetic layer and the barrier layer having exposed sidewalls, the patterning resulting in re-deposition material being deposited on the exposed sidewalls of the upper magnetic layer and the barrier layer;
    vertically depositing a layer of a first dielectric material over the pillars including the top electrodes and on the sidewalls of the upper magnetic layers and the barrier layers having re-deposition material deposited thereon;
    physically etching the pillars so that the top surface of the pillars is etched faster than other surfaces of the pillar, the etching continuing until the first dielectric material has been removed from the top electrode and first dielectric material along with the re-deposited material has been removed the sidewalls of the upper magnetic layer and the barrier layer;

depositing an oxygen-free second dielectric material over the pillars on the wafer;

depositing an inter-layer dielectric (ILD) material over the pillars on the wafer, the ILD material having a higher etching rate in a first selected dry etching process than the second dielectric material;

planarizing the wafer using chemical-mechanical polishing (CMP);

patterning trench lines across the top electrodes, the patterning including using the first selected dry etching process to remove inter-layer dielectric (ILD) material down to the second dielectric material which acts as an etch stop;

removing second dielectric material to expose the top electrodes in the pillars using a second selected dry etching process; and depositing metal over the exposed top electrodes in the trench lines.

2. The method of claim 1 wherein physically etching the pillars further comprises dry etching using an inert gas while applying electrical bias to the wafer.

3. The method of claim 1 wherein the second dielectric material is a silicon nitride or a silicon carbide.

4. The method of claim 1 wherein the inter-layer dielectric (ILD) material is silicon oxide.

5. The method of claim 1 wherein physically etching the pillars further comprises isotropically etching surfaces of the pillars other than the top surface.

6. The method of claim 1 physically etching the pillars leaves residual first dielectric material on planar surfaces between the pillars.

7. The method of claim 6 wherein physically etching the pillars leaves residual re-deposition material on the sidewalls of the bottom electrodes.

8. A method for fabricating thin film magnetic memory cells on a wafer comprising:

depositing a stack of layers for a magnetic tunnel junction memory device including a top electrode, a bottom electrode and an upper magnetic layer and a lower magnetic layer separated by a barrier layer;

patterning the stack of layers to form a plurality of pillars with an upper surface being the top electrode and the upper magnetic layer and the barrier layer having exposed sidewalls, the patterning resulting in re-deposition material being deposited on the exposed sidewalls of the upper magnetic layer and the barrier layer;

depositing a layer of oxygen-free first dielectric material over the pillars including the top electrodes and on the sidewalls of the upper magnetic layers and the barrier layers having re-deposition material deposited thereon, the dielectric material being relatively thin on top of the pillars and relatively thicker in the areas between the pillars;

etching the first dielectric material and re-deposition material using a high density plasma CVD process with a chemistry system selected for more rapid removal of the first dielectric material and slower removal of material forming in the top electrode, the etching continuing until the sidewalls of the barrier layers have been cleaned of re-deposition material;

depositing an oxygen-free second dielectric material over the pillars on the wafer;

depositing an inter-layer dielectric (ILD) material over the pillars on the wafer, the ILD material having a higher etching rate in a first selected dry etching process than the oxygen-free second dielectric material;

planarizing the wafer using chemical-mechanical polishing (CMP);

patterning trench lines across the top electrodes, the patterning including using the first selected dry etching process to remove inter-layer dielectric (ILD) material down to the oxygen-free second dielectric material which acts as an etch stop;

removing oxygen-free second dielectric material to expose the top electrodes in the pillars using a second selected dry etching process; and depositing metal over the exposed top electrodes in the trench lines.

9. The method of claim 8 wherein the oxygen-free second dielectric material is silicon nitride or silicon carbide.

10. The method of claim 8 wherein the a chemistry system in the CVD process is $CH_3OH$ or $CO/NH_3$.

11. A method for fabricating thin film magnetic memory cells on a wafer comprising:

depositing a stack of layers for a magnetic tunnel junction memory device including a top electrode, a bottom electrode and an upper magnetic layer and a lower magnetic layer separated by a barrier layer;

patterning the stack of layers to form a plurality of pillars with an upper surface being the top electrode and the upper magnetic layer and the barrier layer having exposed sidewalls, the patterning resulting in re-deposition material being deposited on the exposed sidewalls of the upper magnetic layer and the barrier layer;

depositing an oxygen-free first dielectric material over the pillars including the top electrodes and on the sidewalls of the upper magnetic layers and the barrier layers having re-deposition material deposited thereon, the first dielectric material having a thickness that is less than the height of the barrier layer in the pillars;

depositing a second dielectric material to a thickness that is greater than the thickness first dielectric material;

planarizing the wafer using chemical-mechanical polishing (CMP);

vertically etching the first and second dielectric materials using a chemistry system that removes of the first and second dielectric materials more rapidly than the material in the top electrodes, the vertical etching continuing until the first dielectric material and the re-deposition material have been removed from the sidewalls of the barrier layers;

depositing an oxygen-free third dielectric material over the pillars on the wafer;

depositing an inter-layer dielectric (ILD) material over the pillars on the wafer, the ILD material having a higher etching rate in a first selected dry etching process than the oxygen-free third dielectric material;

planarizing the wafer using chemical-mechanical polishing (CMP);

patterning trench lines across the top electrodes, the patterning including using the first selected dry etching process to remove inter-layer dielectric (ILD) material down to the third dielectric material which acts as an etch stop;

removing third dielectric material to expose the top electrodes in the pillars using a second selected dry etching process; and depositing metal over the exposed top electrodes in the trench lines.

12. The method of claim 11 wherein the chemistry system used in vertically etching the first and second dielectric materials is $CH_3OH$ or $CO/NH_3$.

13. The method of claim 11 wherein the first dielectric material is selected to be silicon nitride or silicon carbide.

14. The method of claim 11 wherein the second dielectric material is a silicon oxide.

* * * * *